United States Patent
Dhindsa

(10) Patent No.: US 8,337,623 B2
(45) Date of Patent: Dec. 25, 2012

(54) METHODS FOR PLASMA CLEANING AN INTERNAL PERIPHERAL REGION OF A PLASMA PROCESSING CHAMBER

(75) Inventor: Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/191,402

(22) Filed: Jul. 26, 2011

(65) Prior Publication Data

US 2011/0277784 A1    Nov. 17, 2011

Related U.S. Application Data

(62) Division of application No. 11/355,458, filed on Feb. 15, 2006, now Pat. No. 8,012,306.

(51) Int. Cl.
*B08B 6/00* (2006.01)
*H01L 21/461* (2006.01)

(52) U.S. Cl. .......... 134/1.1; 134/1.2; 438/710; 438/729; 438/905

(58) Field of Classification Search .......... 438/710, 438/729, 905; 134/1.1, 1.2
See application file for complete search history.

(56) References Cited

U.S. PATENT DOCUMENTS

| | | | |
|---|---|---|---|
| 5,534,751 A * | 7/1996 | Lenz et al. | 315/111.71 |
| 6,178,919 B1 * | 1/2001 | Li et al. | 118/723 E |
| 6,232,236 B1 * | 5/2001 | Shan et al. | 438/715 |
| 6,465,051 B1 * | 10/2002 | Sahin et al. | 427/534 |
| 6,596,550 B2 * | 7/2003 | Sill et al. | 438/10 |
| 6,841,943 B2 * | 1/2005 | Vahedi et al. | 315/111.71 |

* cited by examiner

*Primary Examiner* — Luz L. Alejandro
(74) *Attorney, Agent, or Firm* — Martine Penilla Group, LLP

(57) ABSTRACT

Methods for operating a plasma processing chamber for a cleaning operation of an internal region of the plasma processing chamber are disclosed. The method is performed when a semiconductor wafer is not present in the plasma processing chamber. The plasma processing chamber has a bottom electrode assembly that includes an inner bottom electrode and an outer bottom electrode, and the inner bottom electrode and outer bottom electrode are electrically isolated by a dielectric ring. The method includes configuring the inner bottom electrode to be set at a floating potential and supplying a process gas into the plasma processing chamber. And, supplying RF power to the outer bottom electrode. The supplying of RF power to the outer bottom electrode is conducted while maintaining the inner bottom electrode at the floating potential and is isolated by the dielectric ring. The RF power produces a plasma that is generated substantially outside of the inner bottom electrode and over the outer bottom electrode. The inner bottom electrode defines a region for holding the semiconductor wafer.

20 Claims, 6 Drawing Sheets

METHODS FOR PLASMA CLEANING AN INTERNAL PERIPHERAL REGION OF A PLASMA PROCESSING CHAMBER

CLAIM OF PRIORITY

This application is a Divisional application claiming priority under 35 U.S.C. 120 of U.S. patent application Ser. No. 11/355,458, filed on Feb. 15, 2006, now issued as U.S. Pat. No. 8,012,306, and entitled "Plasma Processing Reactor With Multiple Capacitive and Inductive Power Sources." The disclosure of this application is incorporated herein by reference in its entirety for all purposes.

CROSS REFERENCE TO RELATED APPLICATION

This application is related to U.S. application Ser. No. 11/363,703, filed on Feb. 27, 2006, entitled "Integrated Capacitive and Inductive Power Sources for Plasma etching Chamber," which is herein incorporated by reference.

BACKGROUND

In the fabrication of semiconductor based devices (e.g. integrated circuits or flat panel displays), layers of material may alternately be deposited onto and etched from a substrate surface (e.g., the semiconductor wafer or the glass panel). As is well known in the art, the etching of the deposited layer(s) may be accomplished by a variety of techniques, including plasma-enhanced etching. In plasma-enhanced etching, the actual etching of the substrate takes place inside a plasma processing chamber. During the etching process, a plasma is formed from a suitable etchant source gas to etch areas of the workpiece that are unprotected by the etch mask, leaving behind the desired pattern.

During plasma etching of a substrate, etch byproduct, which is made of polymers formed by photoresist or etched material layer with etching chemistry, is mainly deposited on the peripheral chamber hardware. The deposited byproduct accumulates with subsequent substrate etching. To improve device yield of substrate manufacturing, it is important to maintain a reproducible chamber, which can be achieved by performing a chamber cleaning process periodically after one or more substrate has been etched. Typically, chamber cleaning is performed after etching every substrate.

Capacitively coupled vacuum plasma systems are frequently employed to etch dielectric material from a semiconductor substrate. The capacitive systems have the advantages of causing low plasma damage and having higher selectivity to the underlayer and photoresist layer. However, when a capacitively coupled plasma is used to clean the chamber after substrate etching, the capacitively coupled plasma, which has relatively high ion energy, would bombard the exposed electrostatic chuck. The electrostatic chuck is used to support the substrate during substrate etching, and bombarding the exposed electrostatic chuck results in electrostatic chuck lifetime degradation and particle generation. In addition, the capacitively coupled plasma generated by the top and bottom electrodes in the chamber is mainly concentrated in the center region above the electrostatic chuck and is not effective in cleaning the peripheral chamber hardware. In order to fully clean the peripheral chamber hardware, extended cleaning time is needed, which impacts the manufacturing throughput. In current capacitively coupled plasma reactors, the chamber clean after processing (or etching) each substrate is generally optimized within the constraints mentioned above.

In view of the foregoing, there is a need for a method and apparatus that provides an improved chamber cleaning mechanism to increase electrostatic chuck lifetime, to improve substrate yield, and to increase manufacturing throughput.

SUMMARY

Broadly speaking, the embodiments of the present invention fill these needs by providing an improved chamber cleaning mechanism. In addition, the embodiments of the present invention provide additional knobs to tune the etch processes. It should be appreciated that the present invention can be implemented in numerous ways, including as a process, an apparatus, or a system. Several inventive embodiments of the present invention are described below.

In one embodiment, a method for operating a plasma processing chamber for a cleaning operation of an internal region of the plasma processing chamber is disclosed. The method is performed when a semiconductor wafer is not present in the plasma processing chamber. The plasma processing chamber has a bottom electrode assembly that includes an inner bottom electrode and an outer bottom electrode, and the inner bottom electrode and outer bottom electrode are electrically isolated by a dielectric ring. The method includes configuring the inner bottom electrode to be set at a floating potential and supplying a process gas into the plasma processing chamber. And, supplying RF power to the outer bottom electrode. The supplying of RF power to the outer bottom electrode is conducted while maintaining the inner bottom electrode at the floating potential and is isolated by the dielectric ring. The RF power produces a plasma that is generated substantially outside of the inner bottom electrode and over the outer bottom electrode. The inner bottom electrode defines a region for holding the semiconductor wafer.

In another embodiment, a method of generating a plasma in a plasma processing chamber is provided. The method initiates with supplying a process gas into the plasma processing chamber. The method continues with creating a plasma by powering an outer bottom electrode which is part of a bottom electrode assembly and surrounds a periphery of an inner bottom electrode of the bottom electrode assembly.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved and more effective and more flexible chamber cleaning and etching system, method and apparatus will now be described. It will be apparent to those skilled in the art that the present invention may be practiced without some or all of the specific details set forth herein.

Figure 1A:
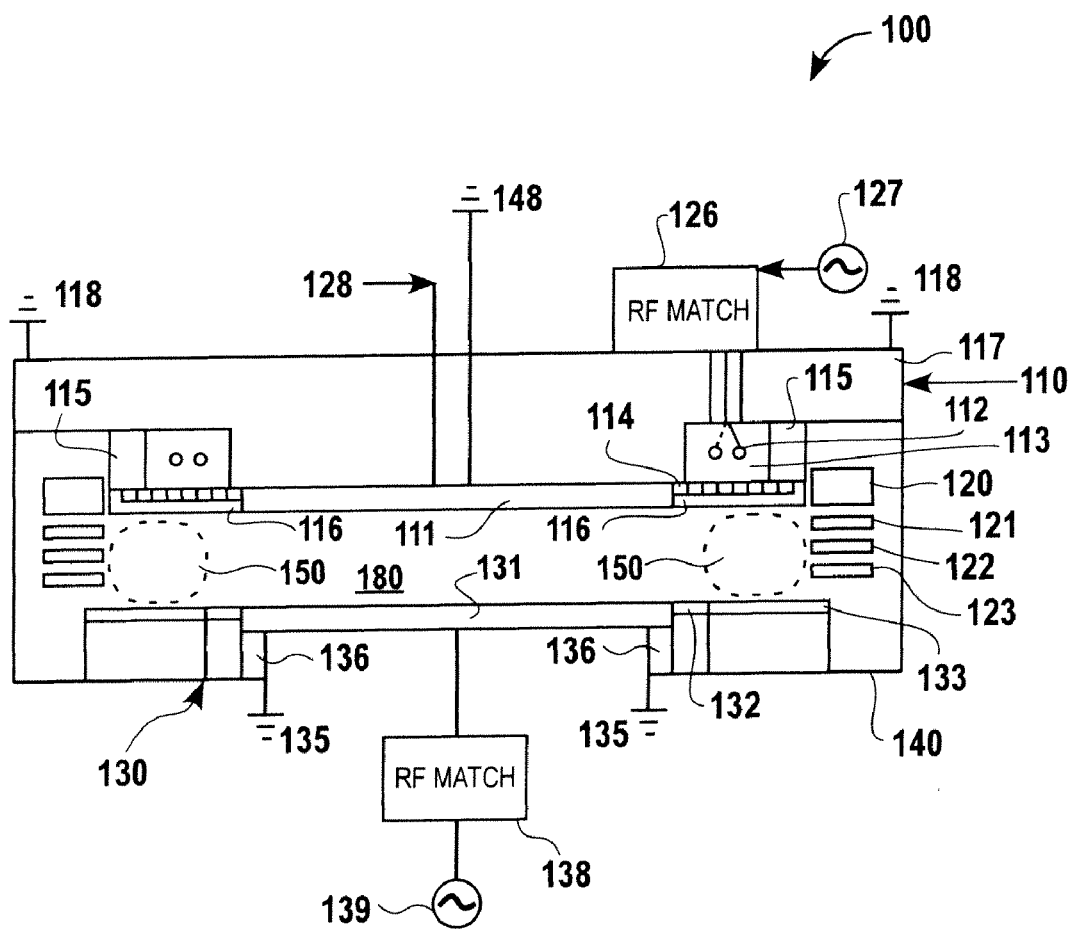
FIG. 1A shows a schematic diagram of one embodiment of a substrate etching system.

As described earlier, a reproducible chamber wall surface condition after etching each substrate would improve the yield. An effective in-situ chamber clean has become a key feature for next generation plasma etch reactor. One embodiment of the present invention provides a second plasma source surrounding the substrate support. The second plasma source, which is placed near the periphery of the process chamber, can be initiated during a chamber clean operation after substrate etching to clean the peripheral chamber hardware that has accumulated etching byproduct during substrate etching. FIG. 1A shows a cross-sectional view of a plasma processing apparatus 100 that has a second plasma source surrounding the substrate support. This embodiment includes a bottom electrode 131 that is composed of a conductive material, which is operatively coupled to a RF (radio frequency) match 138 and a RF power supply 139. The bottom electrode 131 is also a substrate support and is part of a bottom electrode assembly 130. In one embodiment, the RF power supply 139 is a multiple frequency power supply. For example, the power source can have a mixture of frequencies in the range between about 400 kHz to about 60 MHz. Plasma is generated when RF power is delivered from the bottom electrode 131 to the gas inside the process chamber. In one embodiment, the RF power supply delivers RF power levels of up to about 1 Watt to about 10 Watts.

In one embodiment, the bottom electrode assembly 130 has a built-in cooling mechanism (not shown) that can cool the substrate to be in the temperature range between about −20° C. to about 70° C. Surrounding the substrate support is a conductive ring 133 that provides additional grounding path for plasma during substrate processing. Between the bottom electrode 131 and the conductive ring 133, there is a dielectric ring 132 that insulate the substrate support and the conductive ring 133.

By way of example and not of limitation, the bottom electrode 131 has an area that is adapted to receive a 300 mm substrate. In one embodiment, the powered bottom electrode 131 is configured to receive a substrate (not shown) and is configured to clamp the substrate to the bottom electrode 131 during substrate etching operation. The substrate is electrostatically clamped or "chucked" to the bottom electrode using well-known systems and methods. These well-known systems and methods include coating the bottom electrode 131 with a dielectric material that incorporates high-voltage electrodes (not shown) for chucking and dechucking purposes. The plasma processing apparatus 100 includes chamber walls 140 which are grounded through a ground 135. The ground 135 is separated from the bottom electrode 131 by a dielectric material 136.

A first top electrode 111 is disposed a short distance above the bottom electrode 131. Generally, the top electrode 111 is made from a material that is compatible with the substrate to avoid contamination. The first top electrode 111 is part of a top electrode assembly 110, which is connected to a ground 148 and provides a complete electrical circuit for the RF power. The first top electrode 111 has a surface area that may vary from that of the bottom electrode 131. The top electrode assembly 110 is coupled to the chamber cover 117, which is grounded through ground 118. By way of example and not of limitation, the first top electrode 111 is composed of a conductive material such as silicon or silicon carbide. Additionally, by way of example and not of limitation, the first top electrode 111 is located about 2 cm to about 3 cm from the bottom electrode.

Surrounding the top electrode 111 is a second top electrode 112, made of an inductive coil 112. The inductive coil 112 is buried in a dielectric material 113. The coil 112 is coupled to a RF match 126, which is coupled to a RF power source 127. In one embodiment, the RF power source 127 can supply a mixed frequency power. The frequency of power the RF power source 127 can be single or multiple in the range between about 400 kHz to about 27 MHz. In one embodiment, the power to create the inductively coupled plasma is between about 0 watts to about 2000 watts.

A Faraday shield 114 is placed below the dielectric material 113. Surrounding the dielectric material 113 is a conductive block 115, which makes electrical contact with the Faraday shield 114 to provide a grounding path for RF power from the bottom electrode 131. Below and surrounding the outer edge of the Faraday shield 114 is a recessed dielectric ring 116. In one embodiment, the dielectric ring 116 is composed of quartz.

The Faraday shield 114 provides a RF grounding path to the RF power coming from any of the electrodes. The Faraday shield 114 also helps to maintain an area ratio between the grounding area and powering area in the process chamber so the voltage-drops in the chamber during capacitively coupled plasma processing do not change with the introduction of the inductive coil 112. Maintaining the same area ratio allows the etching processes to remain consistent even with the introduction of the inductive coil 112. In addition, the Faraday shield 114 blocks electrical field from the inductive source to minimize capacitive coupling of from the inductive coils 112 during inductive plasma processing to avoid sputtering of chamber components. Details of how to design Faraday shield can be founded in co-assigned U.S. patent application Ser. No. 10/232,564, filed on Aug. 30, 2002, entitled "Faraday Shield Disposed within an Inductively Coupled Plasma Etching Chamber," and U.S. patent application Ser. No. 10/345,582, filed on Jan. 15, 2003, entitled "Dual Interleaved Faraday Shields For An Inductively Coupled Plasma Etching Chamber." Both patent applications are incorporated herein by reference in their entirety for all purposes. During chamber clean, the coil 112 is powered by the RF power source 127 to produce inductively coupled plasma in region 150. During chamber clean, the conductive ring 133 is grounded and the bottom electrode is floating; therefore, the inductively coupled plasma in region 150 is mainly concentrated between the inductive coil 112 and the conductive ring 133.

Surrounding the first top electrode 111 and the second top electrode 112 is an insulator 120. Below the insulator 120 are plasma confinement rings 121, 122, 123. It should be appreciated that here could be one or more plasma confinement rings. The confinement rings 121, 122, 123 provide confinement to the plasma that is generated within the processing chamber. In one embodiment, the confinement rings 121, 122, and 123 are composed of quartz. Details about the plasma confinement rings can be founded in co-assigned U.S.

Pat. No. 6,744,212, issued on Jun. 1, 2004, entitled "Plasma Processing Apparatus And Method For Confining An RF Plasma Under Very High Gas Flow and RF Power Density Conditions," and U.S. Pat. No. 6,872,281, issued on Mar. 29, 2005, entitled "Chamber Configuration For Confining A Plasma." Both patents are incorporated herein by reference.

A gas feed 128 is coupled to the center of the top electrode assembly 110. The gas supplied by the gas feed 128 into the process chamber 100 can be a single gas or a gas mixture of more than one gas. In one embodiment, once the gas reaches the top electrode assembly 110, the gas feed 128 supplies the gas to the process chamber from both the center and the edge of the first top electrode 111. In one embodiment, the first top electrode 111 is also a gas distribution showerhead. By way of example and not of limitation, the total gas flow rate is up to 1500 sccm. In one embodiment, the top electrode assembly 110 also has a heater plate (not shown) that can be used to maintain the temperature of the top electrode 111 to be between about 22° C. to about 200° C.

As described earlier, the top electrode 111 is grounded through ground 148. The top electrode 111 can also be coupled to a RF power source (not shown) or a DC power source (not shown). The power source for the capacitively coupled plasma between the first top electrode 111 and the bottom electrode 131 can come from the power source coupled to the first top electrode 111, instead of the bottom electrode 131. When the power is supplied from the top electrode 111, the bottom electrode 131 is grounded. In addition, the top and bottom electrodes can supply RF power source alternatively. For example, the RF power source for the first top electrode 111 can also have a mixture of frequencies at 2 MHz, 27 MHz, and 60 MHz.

The inductive plasma source can create a high density plasma in the peripheral region 150 without any significant sputtering of the chamber wall materials. As described earlier, sputtering of the chamber wall materials which could contaminate the chamber or decrease the lifetime of the parts. The inductive plasma source can effectively clean polymer (or etch byproduct) deposited on the peripheral chamber hardware, which comes in contact with the etch process plasma.

Figure 1B:
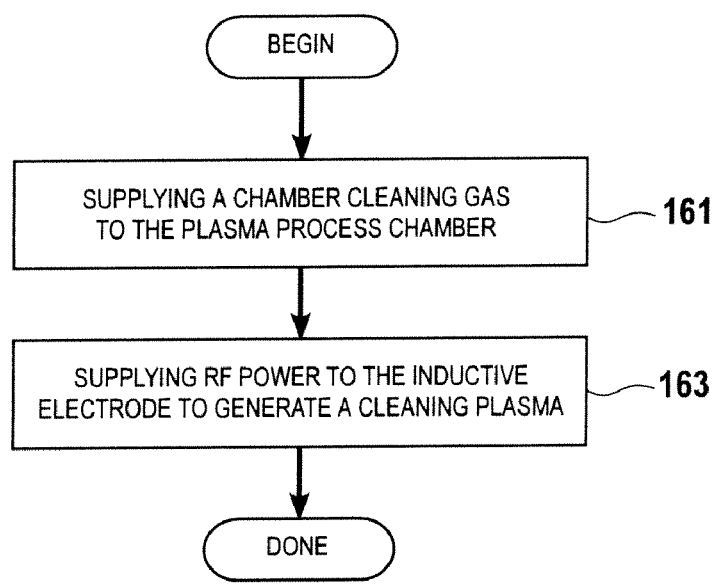
FIG. 1B shows a process flow of generating a cleaning plasma in a plasma system.

FIG. 1B shows an embodiment of a process flow for creating a chamber cleaning plasma. At operation 161, chamber cleaning gas, such as $O_2$, $CF_4$, etc., is supplied to the plasma process chamber. At operation 163, RF power is supplied to the inductive coil 112 of the plasma process chamber 100 to generate the chamber cleaning plasma. The chamber cleaning plasma can then be used to clean the chamber. During chamber cleaning, the bottom electrode 131 is floating. The chamber cleaning plasma in region 150 is away from the bottom electrode 131 and is mainly disposed between the inductive electrode 112 and the conductive ring 133 of FIG. 1A.

Typical parallel plate capacitive coupled plasma shows a drop in plasma density near the edge of the substrate (or wafer) during etching process. The inductive plasma source provides a radial uniformity control knob. The inductive plasma can be turned on during an etching process to provide additional plasma density at the edge of the substrate without affecting the RF ground path of the main capacitive powers. It should be appreciated that the RF grounding path is not affected due to the usage of the Faraday shield. In addition, the inductive source plasma can also provide plasma to processes that require high plasma density and very low ion energy on the substrate, for example photoresist stripping for low-k dielectric etch. Consequently, usage of the inductive source plasma can increase the etch process window of the reactor.

Figure 1C:
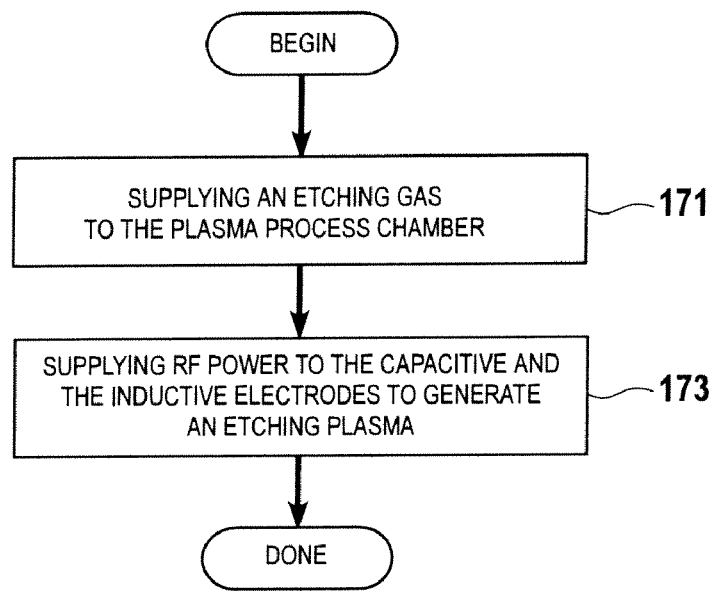
FIG. 1C shows a process flow of generating an etching plasma in a plasma system.

FIG. 1C shows an embodiment of a process flow for generating an etching plasma. At operation 171, etching gas(es), such as Ar, $C_4F_8$, and $O_2$ for high aspect ratio contact etch (HARC), or Ar, $CF_4$, $CHF_3$, and $O_2$ for oxide tech, is supplied to the plasma processing chamber. After the etching gas enters the process chamber, RF power is supplied to the capacitive electrode and the inductive electrode to generate an etching plasma at operation 173. The etching plasma generated has a capacitive component and an inductive component. The inductive component near the substrate edge can increase the plasma density at the substrate edge to make up for the drop of plasma density at the edge of the substrate, as described above. Therefore, the etching plasma can become more uniform across the substrate surface by the addition of the inductive component at the edge of the substrate.

Figure 2:
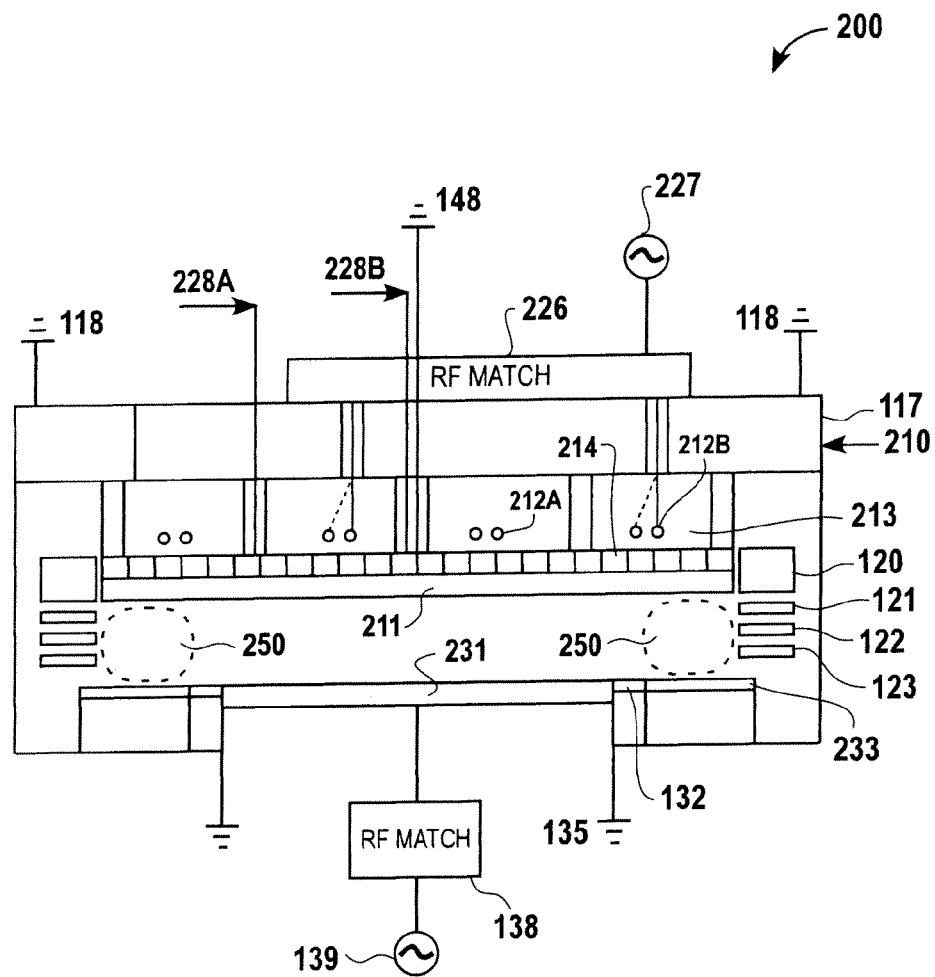
FIG. 2 shows a schematic diagram of another embodiment of a substrate etching system.

FIG. 2 shows a variation 200 of the previous embodiment 100 of FIG. 1A. Two sets of inductive coils 212A, 212B are placed in the top electrode assembly 210. The two set of inductive coils are made of one inner coil 212A and one outer coil 212B. The Faraday shield 214 is placed over the entire top electrode 211 to cover both the inner coil 212A and the outer coil 212B. Faraday shield 214 has similar functions as the Faraday shield 114 of FIG. 1A described above. Both sets of coils 212A, 212B are coupled to a RF match 226, which is coupled to a RF power supply 227. Due to the placement of the two sets of coils 212A, 212B, the process gas is supplied to the top electrode 211, which may also be a showerhead, through a center gas feed 228B and an edge gas feed 228A. Other components in FIG. 2 are similar to those already mentioned in FIG. 1A.

During chamber cleaning, both inductive coils 212A and 212B can be powered, or only the outer coil 212 B is powered, to create a cleaning plasma. If both coils are powered during chamber clean, a percentage of the power can be supplied to the inner coil, for example 0% to 50%, while the remaining power is supplied to the outer coil 112B, for example 50% to 100%. It should be appreciated that the soft inductive plasma would not damage the electrostatic chuck during cleaning. It should be further appreciated that the additional inner inductive coil provides an additional processing tuning knob for the chamber cleaning process. The inner and outer coils can be powered at a different frequency or frequency mixture. Under such a circumstance, the inner and outer coils would need separate power supplies. Additional power supply would be added.

In one embodiment, an inductive plasma in region 250 is created by first supplying a cleaning gas (or a cleaning gas mixture) into the plasma process chamber and then powering the inductive coils 212A and 212B by supplying all the power to coil 212B. During chamber cleaning operation, the bottom electrode 231 may be kept floating and the conductive ring 233 is grounded.

As described above, the inductive plasma source can create high-density plasma in the peripheral area without any significant sputtering of the chamber wall materials, which could contaminate the chamber or decrease the lifetime of the parts. The inductive plasma source can effectively clean polymer (or etch byproduct) deposited on the peripheral chamber hardware, which comes in contact with the etch process plasma.

Both or one of the inductive coils 212A, 212B can also be powered, as well as the capacitive plasma power, to tune the etch plasma uniformity. In addition to the capacitively coupled plasma generated between the top electrode 211 and the bottom electrode 231, the inductive power sources 212A, 212B can also be turned on to create inductive plasma, and can be tuned to improve plasma uniformity across the substrate during an etching process. Typically for capacitively coupled plasma, the plasma density is low at the edge of the substrate. The inductive coil(s) 112 in FIG. 1A and the outer coil(s) 212B in FIG. 2 can help raise the ion density at the edge of the substrate. The inner coil(s) 212A and outer coil(s) 212B of FIG. 2 can also be used simultaneously to tune the plasma density. As mentioned above, a percentage of the power can be supplied to the inner coil(s) 212A, and the remainder supplied to the outer coil(s) 212B. The inner and outer coils 212A, 212B in FIG. 2 provides additional process tuning knobs for etching processes. For some applications, only inductive power from the inductive coils (inner, outer, or both) is utilized to generate inductive plasma.

By using Faraday shield 214, the RF grounding path is not affected. In addition, the inductive source plasma can provide plasma to processes that require high plasma density and very low ion energy on the substrate, such as photoresist stripping or low-k dielectric etch. Therefore, the usage of the two sets of inductive coils would increase the process windows for etch processes. The process flow to generate an etching plasma by the embodiment shown in FIG. 2 is similar to the process flow of FIG. 1C, except that the single inductive electrode is replaced with double inductive electrodes (coils 212A, 212B). The etching plasma generated has a capacitive component and an inductive component. The inductive component can be tuned to increase the plasma uniformity across the substrate.

Figure 3A:
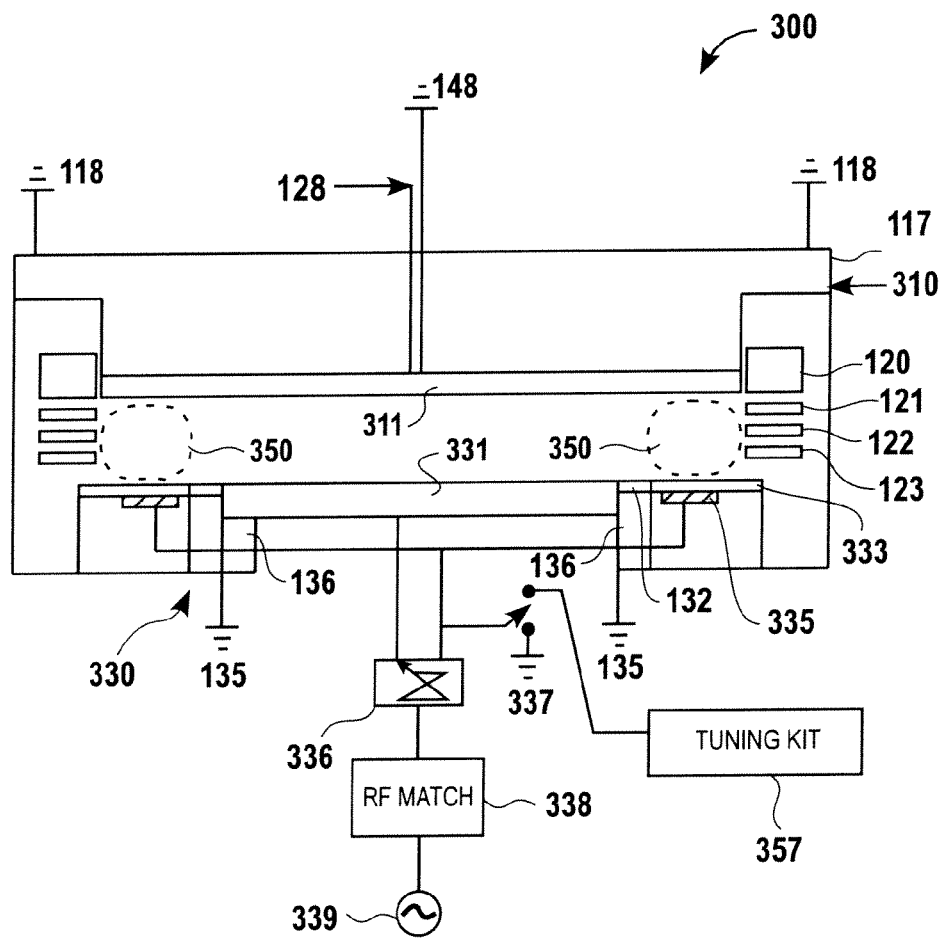
FIG. 3A shows a schematic diagram of another embodiment of a substrate etching system.

Another embodiment 300 of the current invention is shown in FIG. 3A. In FIG. 3A, an outer bottom electrode 335 is placed under a conductive ring 333, in addition to the inner bottom electrode 331. The inner bottom electrode 331 is configured to support a substrate. The outer bottom electrode 335 can be coupled to the same RF power source 339 as the inner bottom electrode 331, which is part of the bottom electrode assembly 330. RF power source 339 can supply single frequency or multiple frequencies in the range between about 400 kHz to about 60 MHz. The RF power source 339 supplies power to the inner bottom electrode 331 and to the outer bottom electrode 335, and is connected to a RF match 338. In one embodiment, switch 336 controls application of the RF power to the electrodes. During substrate etching, switch 336 controls the RF power to be supplied to the inner bottom electrode 331. During this process, the outer bottom electrode 335 could be coupled to ground 337 or to a RF tuning block kit 357. The RF tuning block kit 357 allows selective grounding of certain frequency of the RF power supplied by power supply 339 to the inner bottom electrode 331. For example, if the RF power supplied to the inner bottom electrode 331 includes 2 MHz, 27 MHz and 60 MHz. Selective grounding by the RF tuning block kit 437 allows grounding of one or two particular frequencies, such as 60 MHz, to tune the etching processing uniformity.

Separate power sources can also be used to supply power simultaneously or alternately to the inner bottom electrode 331 and to the outer bottom electrode 335. Other components in FIG. 3A are similar to those already mentioned in FIG. 1A. During chamber cleaning, the power is supplied to the outer bottom electrode 335 to provide a capacitively coupled plasma in region 350 to clean the peripheral chamber. The capacitively coupled plasma in region 350 is generated between the top electrode 311 and the outer bottom electrode 335. During the cleaning process, the bottom electrode may be floating; therefore, the capacitively coupled cleaning plasma, and its destructive effects are kept away from the exposed inner bottom electrode 331 (or electrostatic chuck). In turn, the cleaning plasma does not bombard the inner bottom electrode (or electrostatic chuck), and hence extends the lifetime of the inner bottom electrode (or electrostatic chuck). In addition, not as many particles are generated as using the capacitively coupled plasma from the bottom electrode 331 as compared to prior cleaning technologies.

The peripheral capacitive plasma source creates high-density plasma in the peripheral region 350. It should be appreciated that the capacitive plasma source can effectively clean polymer (or etch byproduct) deposited on the peripheral chamber hardware, which comes in contact with the etch process plasma.

Figure 3B:
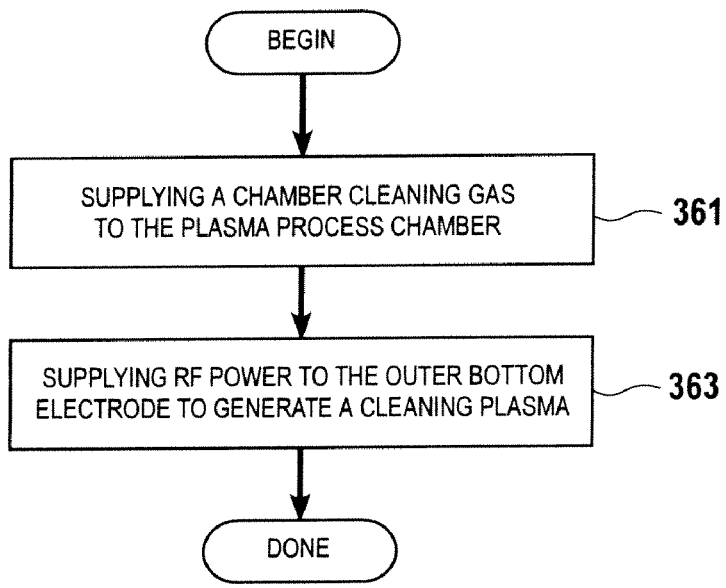
FIG. 3B shows a process flow of generating a cleaning plasma in a plasma system.

FIG. 3B shows an embodiment of a process flow for creating a chamber cleaning plasma. At operation 361, chamber cleaning gas, such as $O_2$, $CF_4$, etc., is supplied to the plasma process chamber. At operation 363, RF power is supplied to the outer bottom electrode of the plasma process chamber to generate the chamber cleaning plasma. The chamber cleaning plasma can then be used to clean the chamber. During chamber cleaning, the inner bottom electrode is kept floating. The chamber cleaning plasma in the peripheral region is substantially away from the bottom electrode and is mainly disposed between the outer bottom electrode and the top electrode.

In addition, the peripheral capacitive plasma source provides the ability to include a radial uniformity control knob. The peripheral capacitive plasma can be turned on during etching process to improve the etch plasma uniformity near the edge of the electrodes for the main capacitively coupled plasma.

Figure 3C:
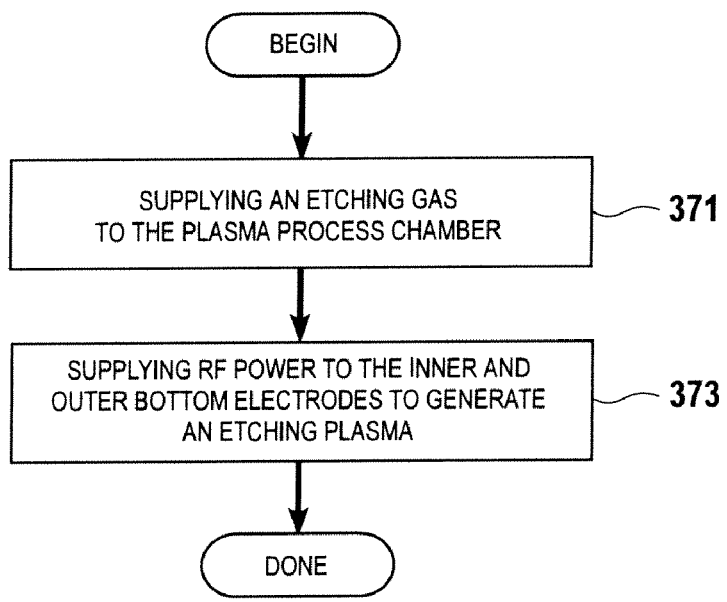
FIG. 3C shows a process flow of generating an etching plasma in a plasma system.

FIG. 3C shows an embodiment of a process flow for generating an etching plasma. At operation 371, etching gas(es), such as Ar, $C_4F_8$, and $O_2$ for high aspect ratio contact etch (HARC), or Ar, $CF_4$, $CHF_3$, and $O_2$ for oxide tech, is supplied to the plasma processing chamber. At operation 373, RF power is supplied to the inner bottom electrode (331) and the outer bottom electrode (335) to generate an etching plasma. It should be appreciated that the outer bottom electrode helps to increase the plasma density near the edge of the substrate.

Figure 4:
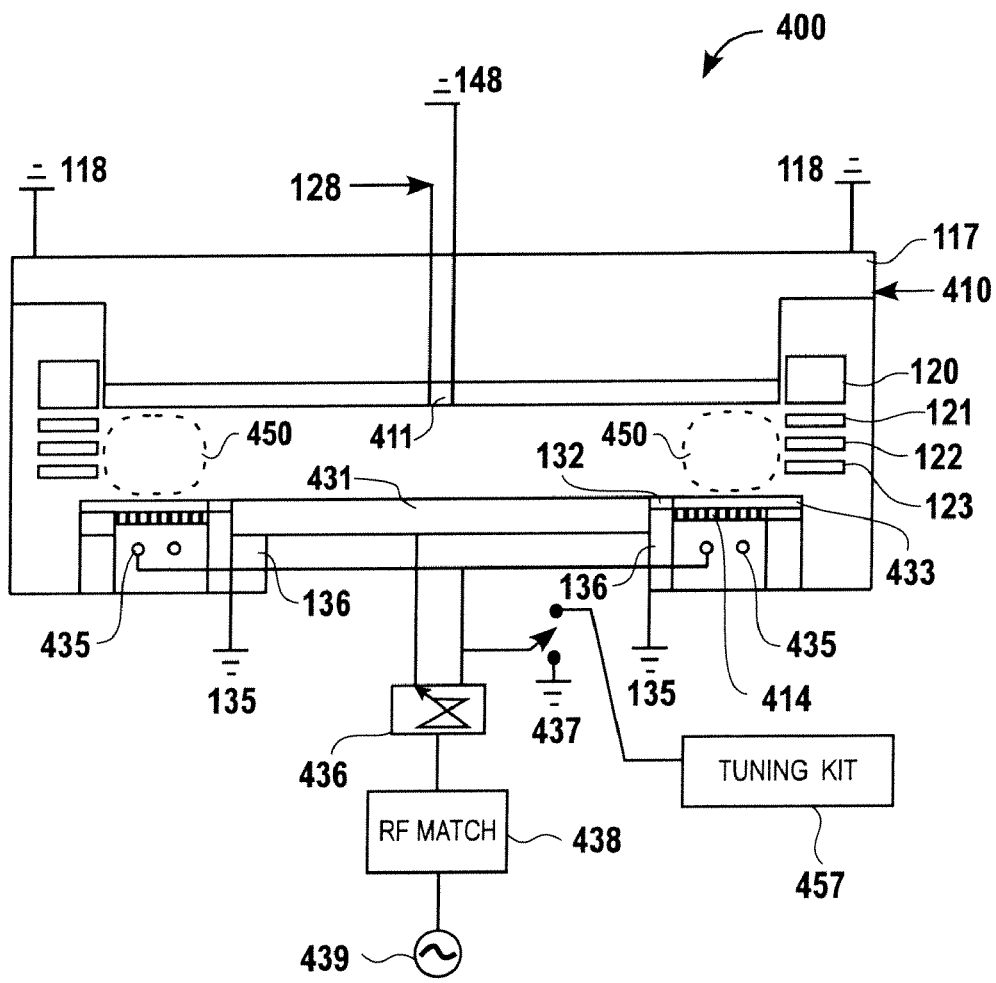
FIG. 4 shows a schematic diagram of yet another embodiment of a substrate etching system.

Another embodiment of the current invention is shown in FIG. 4. In FIG. 4, a second bottom electrode 435, formed by an inductive coil, is placed under the conductive ring 433 and a Faraday shield 414. The second bottom electrode 435 can be coupled to the same RF power source at the first bottom electrode 431. The RF power source 439 supplies RF power to the first bottom electrode 431 or to the second bottom electrode 435 and is controlled by a switch 436. RF power source 439 can supply single frequency or multiple frequencies in the range between about 400 kHz to about 60 MHz. The RF power source 439 supplies power to the inner bottom electrode 431 and to the outer bottom electrode 335, and is connected to a RF match 438. In one embodiment, switch 436 controls application of the RF power to the electrodes. During substrate etching, switch 436 controls the RF power to be supplied to the inner bottom electrode 431. During this process, the outer bottom electrode 335 could be coupled to ground 437 or to a RF tuning block kit 457. RF power source 439 can supply single frequency or multiple frequencies in the range between about 400 kHz to about 60 MHz. The RF power source 439 supplies power to the inner bottom electrode 431 and to the outer bottom electrode 435, and is connected to a RF match 438. In one embodiment, switch 436 controls application of the RF power to the electrodes. During substrate etching, switch 436 controls the RF power to be supplied to the inner bottom electrode 431. During this process, the outer bottom electrode 435 could be coupled to ground 437 or to a RF tuning block kit 457.

Separate RF power supplies can also be used to provide RF power to the bottom electrode 431 and to the second bottom electrode 435. During substrate etching, the power is supplied to the bottom electrode 431. Other components in FIG. 4 are similar to those already mentioned in FIG. 1A.

During chamber cleaning, the cleaning gas is first supplied to the plasma process chamber. Afterwards, the power is supplied to the second bottom electrode 435 to provide inductively coupled plasma in region 450 to clean the peripheral chamber hardware. The inductively coupled plasma in region 450 is generated between the top electrode 411 and the second bottom electrode 435 and exists mainly near the edge of the chamber. Since the plasma is near the edge of the chamber and is generated from an inductive source (low ion energy), the plasma does not bombard the bottom electrode (or electrostatic chuck) as much and extends the life-time of the bottom electrode, or electrostatic chuck. Additionally, the plasma does not create as many particles as using the capacitively coupled plasma from the first bottom electrode 431.

As described above, the inductive plasma source can create high-density plasma in the peripheral area without any significant sputtering of the chamber wall materials, which could contaminate the chamber or decrease the lifetime of the parts. The inductive plasma source can effectively clean polymer (or etch byproduct) deposited on the peripheral chamber hardware, which comes in contact with the etch process plasma without the deleterious effects of prior art techniques.

Typical parallel plate capacitive coupled plasma shows a drop in plasma density near the edge of the chamber during etching process. The inductive plasma source mentioned above provides a radial uniformity control knob. The inductive plasma can be turned on during etching process to provide additional plasma density at the edge of the electrodes without affecting the RF ground path of the main capacitive powers. In addition, the inductive source plasma can provide plasma to processes that require high plasma density and very low ion energy on the substrate, for example photoresist stripping or low-k dielectric etch. Therefore, usage of the extra peripheral electrode can increase the process windows for etching processes as well as more effectively clean the chamber between etch operations.

The plasma process chamber described above provides a range of plasma density, ion energy, and chemistry control for a wide range of process application, such as dual damascene multi-step processes, high aspect ratio contact etch (HARC), strip, etc., along with effective chamber clean by a combination of capacitive and inductive plasma sources. In one embodiment, the effective chamber clean can be applied for next generation particle control to improve yield and to extend the life-time of the electro-static chucks used in the etching chamber.

The plasma process chamber described above provides knobs to control radial uniformity of process parameters on the substrate. The process applications that use multi-step recipes involve a range of process pressure, RF power, and chemistries that produce a wide range of center to edge uniformity. The availability of in-situ control knobs provides flexibility for maintaining tight uniformity control for the process applications that use multi-step recipes as feature sizes continue to shrink.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of generating a plasma in a plasma processing chamber, comprising method operations of:
setting the plasma processing chamber to perform a cleaning operation, the plasma processing chamber having a bottom electrode assembly that includes an inner bottom electrode and an outer bottom electrode, the inner bottom electrode and outer bottom electrode being electrically isolated by a dielectric ring, the plasma processing chamber having a top electrode, the top electrode disposed above the inner bottom electrode, the setting includes:
setting the inner bottom electrode to be at a floating potential instead of being connected to radio frequency (RF) power;
grounding the top electrode while the inner bottom electrode is maintained at the floating potential;
supplying a process gas into the plasma processing chamber; and
supplying the RF power to the outer bottom electrode, the supplying of RF power to the outer bottom electrode while maintaining the inner bottom electrode at the floating potential and isolated by the dielectric ring produces a plasma that is generated substantially outside of the inner bottom electrode and over the outer bottom electrode.

2. The method of claim 1, wherein supplying RF power to the outer bottom electrode switches RF power away from the inner bottom electrode and to the outer bottom electrode.

3. The method of claim 1, wherein the plasma is generated adjacent to internal peripheral regions of the chamber to assist in removal of plasma byproducts that adhere to surfaces at the internal peripheral regions.

4. The method of claim 1, wherein when the RF power is supplied to the outer bottom electrode, the top electrode of the plasma processing chamber is coupled to ground to enable capacitive coupling.

5. The method of claim 1, wherein the process gas is tuned for enabling dry etching within the plasma processing chamber.

6. The method of claim 1, wherein the plasma is produced adjacent to a plasma confinement structure within a process volume of the plasma processing chamber, such that the plasma impacts etch byproducts that is accumulated on and around the plasma confinement structure.

7. The method of claim 1, wherein the top electrode has a flat surface that faces the inner bottom electrode.

8. A method of generating a plasma in a plasma processing chamber, comprising method operations of:
setting the plasma processing chamber to perform a cleaning operation, the plasma processing chamber having a bottom electrode assembly that includes an inner bottom electrode and an outer bottom electrode, the inner bottom electrode and outer bottom electrode being electrically isolated by a dielectric ring, the plasma processing chamber having a top electrode, the top electrode disposed over the inner bottom electrode, the setting includes:
setting the inner bottom electrode to be at a floating potential instead of being coupled to radio frequency (RF) power;
grounding the top electrode while the inner bottom electrode is maintained at the floating potential;
supplying a process gas into the plasma processing chamber; and
supplying the RF power to the outer bottom electrode, the supplying of RF power to the outer bottom electrode while maintaining the inner bottom electrode at the floating potential produces a plasma that is generated substantially outside of the inner bottom electrode and over the outer bottom electrode, wherein the inner bottom electrode defines a region for receiving a semiconductor wafer, and the semiconductor wafer is configured to not be present when the RF power is supplied to the outer bottom electrode to effectuate the cleaning operation.

9. The method of claim 8, wherein supplying RF power to the outer bottom electrode switches RF power away from the inner bottom electrode and to the outer bottom electrode.

10. The method of claim 8, wherein the plasma is generated adjacent to internal peripheral regions of the chamber to assist in removal of plasma byproducts that adhere to surfaces at the internal peripheral regions.

11. The method of claim 8, wherein when the RF power is supplied to the outer bottom electrode, the top electrode of the plasma processing chamber is coupled to ground to enable capacitive coupling.

12. The method of claim 8, wherein the process gas is tuned for enabling dry etching within the plasma processing chamber.

13. The method of claim 8, wherein the plasma is produced adjacent to a plasma confinement structure within a process volume of the plasma processing chamber, such that the plasma impacts etch byproducts that is accumulated on and around the plasma confinement structure.

14. The method of claim 8, wherein the top electrode has a flat surface that faces the inner bottom electrode.

15. A method for operating a plasma processing chamber for a cleaning operation of an internal region of the plasma processing chamber, when a semiconductor wafer is not present in the plasma processing chamber, comprising:

during the cleaning operation:

setting an inner bottom electrode of the plasma processing chamber to be at a floating potential instead of being coupled to radio frequency (RF) power, the plasma processing chamber having a bottom electrode assembly that includes the inner bottom electrode and an outer bottom electrode, the inner bottom electrode and outer bottom electrode being electrically isolated by a dielectric ring, the inner bottom electrode defining a region for holding the semiconductor wafer, the plasma processing chamber having a top electrode, the top electrode disposed over the inner bottom electrode;

supplying a process gas into the plasma processing chamber;

grounding the top electrode while the inner bottom electrode is maintained at the floating potential;

supplying the RF power to the outer bottom electrode, the supplying of RF power to the outer bottom electrode being conducted while maintaining the inner bottom electrode at the floating potential, the RF power producing a plasma that is generated substantially outside of the inner bottom electrode and over the outer bottom electrode.

16. The method of claim 15, wherein supplying RF power to the outer bottom electrode switches RF power away from the inner bottom electrode and to the outer bottom electrode.

17. The method of claim 15, wherein the plasma is generated adjacent to internal peripheral regions of the chamber to assist in removal of plasma byproducts that adhere to surfaces at the internal peripheral regions.

18. The method of claim 15, wherein when the RF power is supplied to the outer bottom electrode, the top electrode of the plasma processing chamber is coupled to ground to enable capacitive coupling.

19. The method of claim 15, wherein the process gas is tuned for enabling dry etching of surfaces in the plasma processing chamber, when the semiconductor wafer is not present.

20. The method of claim 15, wherein the plasma is produced adjacent to a plasma confinement structure within a process volume of the plasma processing chamber, such that the plasma impacts etch byproducts that is accumulated on and around the plasma confinement structure.

* * * * *